United States Patent [19]

Sellschopp

[11] Patent Number: 4,548,698
[45] Date of Patent: Oct. 22, 1985

[54] EQUIPMENT FOR PRODUCING COATINGS HAVING A ROTATIONALLY SYMMETRIC THICKNESS PROFILE BY CATHODIC EVAPORATION

[75] Inventor: Michael Sellschopp, Hammersbach, Fed. Rep. of Germany

[73] Assignee: Leybold-Heraeus GmbH, Cologne, Fed. Rep. of Germany

[21] Appl. No.: 575,873

[22] Filed: Feb. 1, 1984

[30] Foreign Application Priority Data

Feb. 26, 1983 [DE] Fed. Rep. of Germany ....... 3306870

[51] Int. Cl.$^4$ .............................................. C23C 15/00
[52] U.S. Cl. .................................. 204/298; 204/192 R
[58] Field of Search ........................... 204/192 R, 298; 118/720

[56] References Cited

U.S. PATENT DOCUMENTS 4,303,489 12/1981 Morrison, Jr. .................. 204/192 R
4,409,087 11/1983 Quick .................................. 204/298

Primary Examiner—Andrew H. Metz
Assistant Examiner—William T. Leader
Attorney, Agent, or Firm—Max Fogiel

[57] ABSTRACT

The invention concerns equipment for producing coatings having a rotationally symmetric thickness profile on substrates. The equipment comprises an evaporizing cathode and, for each substrate, a mask and a rotatable substrate holder arranged behind the mask. The mask has a cut-away portion such that the desired thickness profile of the coating can be produced by rotating the substrate.

According to the invention and for the purpose of increasing the throughput of the equipment while maintaining close tolerances for the thickness profile of the coatings, a plurality of masks (6) and a plurality of substrate holders (13) associated with the masks are provided on a common movable frame (1). The movable frame (1) is displaceable relatively to the evaporizing cathode (10), continuous rotary movement being imparted to the substrate holders.

5 Claims, 1 Drawing Figure

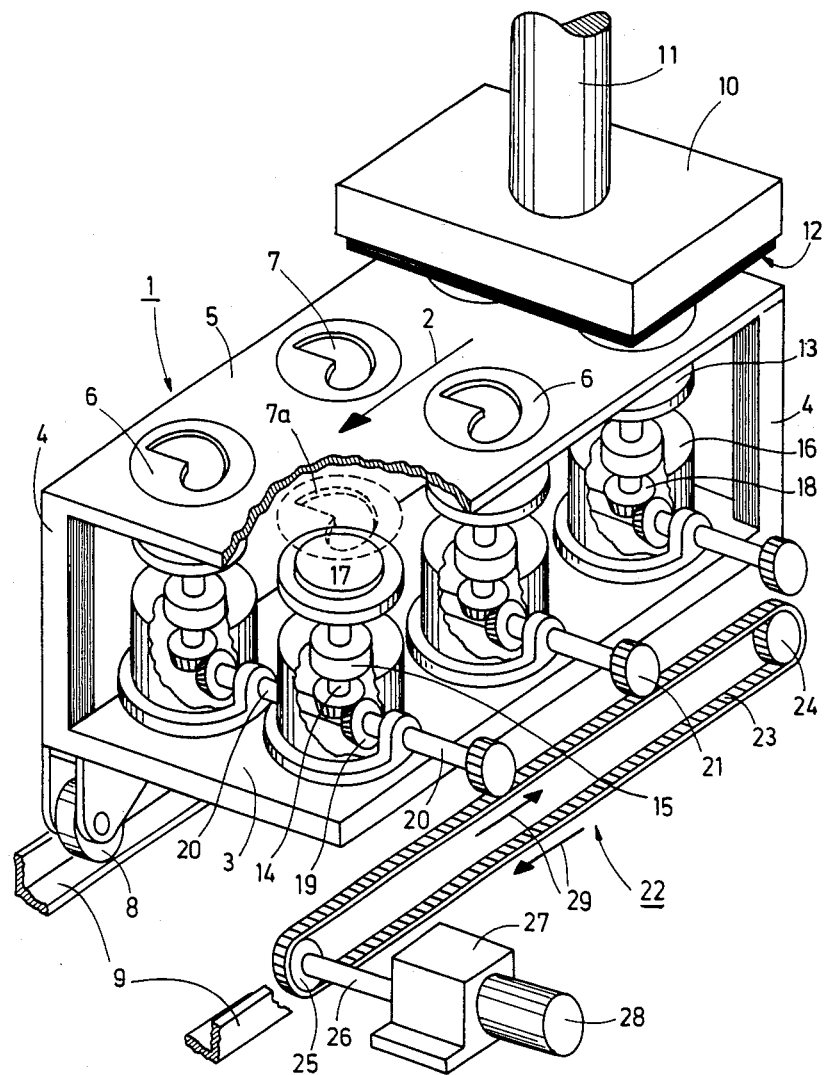

EQUIPMENT FOR PRODUCING COATINGS HAVING A ROTATIONALLY SYMMETRIC THICKNESS PROFILE BY CATHODIC EVAPORATION

The invention concerns equipment for producing coatings having a rotationally symmetric thickness profile on substrates by cathodic evaporation, which equipment consists of an evaporizing cathode, a mask for each substrate and a rotatable substrate holder arranged behind each mask, which has a cut-away portion such that the required coating-thickness profile can be produced by rotating the substrate.

It is known that the evaporation rate of a target associated with the cathode varies greatly over its area. In the case of a stationary substrate, this manifests itself in a greatly varying thickness profile of the condensed coating, and a very clear falling away of thickness can be observed at the edges of the coating. Uneven evaporation rates are particularly pronounced in the case of what are called magnetron cathodes, since the magnetic field, which is closed like a tunnel in such systems, spatially limits the glow-discharge which causes the evaporation process. The zones of maximum evaporation rate are located at those places where the magnetic field lines extend parallel to the surface of the target. Magnetron cathodes have an evaporation rate which is greater by a factor of 10 to 30, but in the case of stationary substrates they do not provide acceptable thickness profiles in the condensed coatings. As is well known, a method of obtaining the greatest possible degree of uniformity in the thicknesses of coatings consists in selecting target dimensions that are greater than the area in which the substrates are arranged, and in addition the substrates are permitted to execute a movement relative to the cathode or target. Thus, for example, by means of magnetron cathodes in the form of strips of considerable length, window panes having dimensions of 3×4 meters can be coated in a uniform manner.

However, cases arise wherein it is specifically required to produce coatings having a definite thickness profile. These include coatings having a rotationally symmetric thickness profile. Coatings of this kind are used in particular in the case of echelon filters and flow filters as employed for compensating for the radial drop in brilliance in photographic lenses, particularly in the wide-angle range. At the centre, such filters have a relatively high absorption which diminishes towards the edge zone in accordance with a specific mathematical function and which may reach a zero value. The production of such filters and equipment used for the purpose are described in DE-PS No. 28 15 704.

The equipment disclosed in that specification comprises a plurality of substrate holders which are parts of a planetary gear and are all rotated thereby. The known equipment has a single cathode but only one aperture, associated with the cathode, for producing the thickness profile. The substrates are individually swung one after the other through the aperture and into the path of the stream of material from the target through the aperture, and rotattion of the substrates is maintained. The throughput of the equipment is relatively small and it is therefore not very economical; conditions could be improved only by providing a large number of cathodes. However, such a step is expensive and the system can be controlled only with difficulty since experience has shown that like evaporation and condensation conditions at all the cathodes cannot be readily achieved.

The object of the present invention is therefore to improve the known equipment in such a way that greater productivity, accompanied by more precise maintenance of the thickness profile of the condensed coating is achieved, without the need for a corresponding consumption of the evaporizing cathode.

According to the invention and in the case of the initially described equipment, this object is achieved in that a plurality of masks and a plurality of substrate holders associated with the masks are arranged on a common movable frame which is displaceable while the substrate holders execute a continuous rotary movement relative to the evaporizing cathode.

BRIEF DESCRIPTION OF THE DRAWING

The single FIGURE is a perspective view of one embodiment of a cathodic evaporation apparatus in accordance with the present invention.

Because of the presence of a plurality of masks and of a plurality of substrate holders associated with the masks in a spatially fixed manner, it is possible to keep several substrates simultaneously in readiness for the coating operation, and then the number of substrates that are located simultaneously in the coating zone depends only upon the area of the target, i.e. of the cathode, in relation to the line enclosing all of the substrate holders. Whereas the target dimensions transversely of the direction of travel of the moving frame are somewhat greater than the distances between the outermost points of the masks or substrate holders, the length of the movable frame in the direction of travel can be several times greater than the corresponding dimensions of the target.

By the use of the features constituting the invention, three functional principles which run counter to each other are supplemented and implemented. Because of the relative movement of the movable frame and the evaporizing cathode, the very different evaporizing rate of the target in relation to the condensation process is evened out in the zone of the plane of the masks. By means of the masks, which are stationary in relation to the movable frame, a selected profile of the stream of material is let through towards the substrate holders, i.e. a lack of uniformity is again produced. Because of the execution of the rotary movement by the substrate holders relative to the masks, this lack of uniformity, characterized by asymmetry, is again converted into a rotationally symmetric profile of the thickness of the coating, so that the properties required in the end product are achieved. It might be at least feasible to keep the substrates stationary in relation to the moving frame and to impart rotary movement to all of the masks, but the lack of uniformity in the evaporization rate, occurring also in the longitudinal direction of the cathode, would lead to a certain divergence of the rotational symmetry of the coating. This means that each substrate holder carries only a substrate concentric with its axis of rotation.

Because of the construction of the movable frame as provided for by the invention, a quasi-continuous operation of the equipment is also possible when, for example, this equipment is designed as what is known as a line-production installation and is equipped with lock chambers at its two ends disposed in the direction of travel of the movable frame. In this way, the equipment, operating in accordance with the line-production system, can be provided with several movable frames, so that the productivity of the equipment is further increased.

The equipment in accordance with the invention offers very particular advantages when used in conjunction with magnetron cathodes, since these enable a satisfactorily high rate of deposition to be achieved even when the movable frame is displaced continuously relatively to the cathode.

It will be understood that the speed of revolution of the substrate holders at their centre circumference is several times greater than the translatory speed of the movable frame. The economics of the equipment can be further improved by providing several magnetron cathodes one after the other in the direction of travel of the frame, their longest axes being at right angles to the direction of travel. What are known as planar magnetrons can be used with particular advantage in this connection.

Assuming a similar aperture geometry in all of the substrate holders, considerable uniformity in the thickness profiles of the coatings can be achieved on all the substrates of a charge when using the equipment in accordance with the invention. However, in contrast to the prior art disclosed in DE-PS No. 28 15 704, the equipment of the invention permits the almost simultaneous production of coatings having a differing thickness profile when different masks are used for various substrate holders. It is feasible for example, to produce, together with filters having a continuously changing thickness of coating, filters having a stepped thickness of coating, this being achieved simply by replacing some of the masks by suitably designed other masks.

An improved form of construction of the equipment can be achieved if, in accordance with a further feature of the invention, at least one drive roller, having an axis of rotation at right angles to the direction of travel of the movable frame, is arranged on said frame, if a drive member with which the drive roller engages over at least part of its distance of travel is arranged parallel to the direction of travel, and if the drive roller is coupled to at least one substrate holder.

By means of this arrangement, the displacement of the movable frame relatively to the drive member automatically causes the substrate holder to rotate, so that complicated transmission mechanisms can be dispensed with. With particularly advantageous results, the drive member can be caused to execute an additional movement, which can also be varied by means of a suitable control or regulation means, so that the required high speed revolution of the substrate holder as compared with the speed of travel of the frame can be achieved.

The drive member can be formed by various machine elements. For example, it may be constituted by a threaded spindle of suitable length in which the drive roller or rollers engages or engage in the manner of a worm wheel. When the threaded spindle is stationary, the drive roller runs off as in the case of a toothed rack. Depending upon the direction of rotation or speed of rotation of the threaded spindle, an additional speed of revolution can be applied to the drive roller.

However, still further advantage can be achieved if, in accordance with a further feature of the invention, the drive member is an endless chain which is guided around two sprocket wheels arranged one behind the other in the direction of travel and which can be caused to circulate by means of a drive motor. Here again, by appropriate selection of direction and speed of revolution, it is possible to impart a corresponding superposed speed of revolution to the drive roller, so that the substrate holder acquires the required speed of revolution. Instead of an endless chain, use can be made of externally toothed belts, endless cables with friction coverings, etc.

An example illustrating a form of construction of the subject-matter of the invention will now be described in greater detail by reference to the attached single drawing.

The drawing shows a movable frame 1, the direction of travel of which is indicated by an arrow 2. The movable frame comprises a base plate 3 above which a mask carrier 5 is mounted on uprights 4; six masks 6 are removably arranged in the mask carrier 5. Each of the masks has a cut-away portion 7; the method of calculating the contour of the cut-away portion 7 is set forth in DE-PS No. 28 15 704. During relative movement of the previously described parts, this contour determines the thickness profile of the coating, the radial change in which is likewise determined beforehand by calculation. It follows from this that different contours can be selected for the cut-away portions 7 and, as explained above, the contours of the various masks can also differ. In the drawing, one of the front corners of the mask carrier 5 is shown as broken away so as to provide a view into the movable frame. The cut-away portion in the mask at this area is designated by the reference numeral 7a.

The movable frame 1 has four roller runners 8, only one of which is shown in the drawing. The movable frame 1 can be displaced on rails 9 in the direction indicated by the arrow 2 by means of these roller runners, the associated drive for imparting movement, which can be formed by an endless chain, not being illustrated.

Located above the movable frame 1 is an evaporizing cathode 10 which, by means of an insulating upright support 11, is attached to the surface of a vacuum chamber, not illustrated, in which a vacuum of the order of magnitude of $10^{-1}$–$10^{-4}$ mbars can be set up for the purpose of creating a glow discharge. Associated with the evaporizing cathode 10 and attached to its lower face is a target 12 which is atomized by the glow-discharge process. Details of this process likewise form part of the prior art as does the construction of a magnetron cathode, particulars of which are described in, for example, DE-OS No. 30 47 113.

Arranged on the base plate 3 are substrate holders 13 which correspond in number (six) and spatial distribution to the masks 6; these substrate holders are in the form of round discs and, by means of vertical shafts 14, are mounted in bearings 15 which are screwed to the base plate 3 by way of bearing housings 16. The arrangement is such that the central axis, on which the calculation for each cut-away portion 7 is based, is aligned with the axis of rotation of each associated substrate holder 13. A substrate 17, having the shape of a round disc is concentrically arranged on each substrate holder. The arrangement is repeated six times in all and, as can be seen from the drawing, three masks 6 and three substrate holders 13 are arranged one behind the other in two parallel rows extending in the direction of travel.

Located at the lower end of each shaft 14 is a bevel wheel 18 which meshes with a further bevel wheel 19. The shaft 20 of each bevel wheel 19 lies at right angles to the shaft 14 and therefore horizontally, and carries at its opposite end a drive roller 21, the axis of rotation of which likewise extends at right angles to the direction of travel. It will be seen that rotation of the drive roller 21 imparts corresponding rotation to the substrate holder 13. The drives for all of the substrate holders 13 may be linked with each other in a manner not illustrated, so that only one drive roller 21 is required for powering all of the substrate holders 13.

Arranged parallel to the direction of travel is a drive member 22 with which the drive roller 21 is in engagement over part of its path of travel. In the present case, the drive member 22 is constituted by an endless chain 23 which is guided round two sprockets 24 and 25 disposed one behind the other in the direction of travel. The sprocket 25 is connected, by way of a shaft 26, to the reduction gear 27 of a drive motor 28. The drive roller 21 is of course likewise formed as a toothed wheel, i.e. it engages, by means of teeth not shown, in the upper strand of the endless chain 23. Care is of course taken to ensure that the teeth of the drive roller 21 and those of the sprockets 24 and 25 do not impede each other, so that a double chain can be used with very great advantage.

Assuming that the endless chain 23 is not moving, then the drive roller 21, during its travel on to the upper strand of the endless chain 23, is caused to rotate at a peripheral speed which corresponds to the translatory speed of the movable frame 1. If the endless chain 23 is then caused to circulate in the direction indicated by the arrows 29, the speed of circulation of the endless chain 23 is superposed upon the translatory speed of the movable frame 1, and the substrate holders 13 are driven at a correspondingly higher speed. Thus, the required higher average higher peripheral speed of the substrates 17, relative to the said translatory speed, can be achieved in a simple manner.

I claim:

1. Apparatus for producing coatings on substrates by cathodic evaporation comprising: an evaporating cathode; a mask for each substrate; a rotatable substrate holder spaced from each mask; said coatings having a thickness profile that is symmetrical with respect to an axis of rotation; said mask having a cut-away portion for producing a predetermined coating-thickness profile by rotating the substrate about said axis; a common movable frame for mounting each mask and substrate holder associated with the mask; means for continuously rotating the substrate holder about said axis relative to said evaporizing cathode, said movable frame being displaceable during rotary movement of the substrate holder, said mask being arranged in a plane and having a central axis, said axis of rotation of said substrate holder being perpendicular to the plane of said mask and being coaxial to said central axis of the mask, each substrate executing simultaneously a rotary movement about its own axis and central axis of the mask and executing at the same time a translatory movement due to translatory displacement of said common movable frame.

2. Apparatus as defined in claim 1, wherein said evaporizing cathode comprises a planar magnetron.

3. Apparatus for producing coatings on substrates by cathodic evaporation comprising: an evaporating cathode; a mask for each substrate; a rotatable substrate holder spaced from each mask; said coatings having a thickness profile that is symmetrical with respect to an axis of rotation; said mask having a cut-away portion for producing a predetermined coating-thickness profile by rotating the substrate about said axis; a common movable frame for mounting each mask and substrate holder associated with the mask; means for continuously rotating the substrate holder about said axis relative to said evaporizing cathode, said movable frame being displaceable during rotary movement of the substrate holder, said mask being arranged in a plane and having a central axis, said axis of rotation of said substrate holder being perpendicular to the plane of said mask and being coaxial to said central axis of the mask, each substrate executing simultaneously a rotary movement about its own axis and central axis of the mask and executing at the same time a translatory movement due to translatory displacement of said common movable frame; at least one drive roller mounted on said movable frame and having an axis of rotation perpendicular to the direction of travel of the movable frame; a drive member engaging said drive roller over at least part of its distance of travel and being arranged parallel to the direction of travel of said movable frame, said drive roller being coupled to at least one substrate holder.

4. Apparatus as defined in claim 3, wherein said drive member comprises an endless chain guided around two sprocket wheels arranged one behind the other in said direction of travel, and motor means for driving said endless chain.

5. Apparatus as defined in claim 3, wherein said evaporizing cathode comprises a planar magnetron.

* * * * *